(12) United States Patent
Hocker et al.

(10) Patent No.: US 12,231,526 B2
(45) Date of Patent: Feb. 18, 2025

(54) METHOD AND TIMING RECOVERY CIRCUIT FOR RECOVERING A SAMPLING CLOCK FROM A SERIAL DATA STREAM ENCODED USING PAM

(71) Applicant: SILICONALLY GMBH, Dresden (DE)

(72) Inventors: Thomas Hocker, Dresden (DE); Sebastian Hoeppner, Dresden (DE)

(73) Assignee: SILICONALLY GMBH, Dresden (DE)

( * ) Notice: Subject to any disclaimer, the term of this patent is extended or adjusted under 35 U.S.C. 154(b) by 0 days.

(21) Appl. No.: 18/040,371

(22) PCT Filed: Aug. 2, 2021

(86) PCT No.: PCT/EP2021/071581
§ 371 (c)(1),
(2) Date: Feb. 2, 2023

(87) PCT Pub. No.: WO2022/029085
PCT Pub. Date: Feb. 10, 2022

(65) Prior Publication Data
US 2024/0063996 A1    Feb. 22, 2024

(30) Foreign Application Priority Data

Aug. 6, 2020  (EP) .................... 20189884

(51) Int. Cl.
*H04B 3/32*   (2006.01)
*H04L 7/00*   (2006.01)

(52) U.S. Cl.
CPC .......... *H04L 7/0004* (2013.01); *H04L 7/0062* (2013.01)

(58) Field of Classification Search
CPC .......... H04L 25/03057; H04L 25/4917; H04L 25/03885; H04L 7/033; H04L 7/0087; H04L 25/03343; H04L 7/0334; H04L 25/061; H04B 10/40; H04B 10/541; H04B 10/524; H04B 10/801; H04B 10/27; H04B 10/5161; H04B 1/04; H04B 10/516; H04B 1/16; H03L 7/0807; H03L 7/099;
(Continued)

(56) References Cited

U.S. PATENT DOCUMENTS 7,149,265 B2   12/2006  Wang et al.
7,489,749 B2    2/2009  Liu
(Continued)

OTHER PUBLICATIONS

International Search Report and Written Opinion issued in PCT/EP2021/071581 mailed Dec. 9, 2021.
(Continued)

*Primary Examiner* — Eva Y Puente
(74) *Attorney, Agent, or Firm* — Nicholas Mesiti; HESLIN ROTHENBERG FARLEY & MESITI P.C.

(57) ABSTRACT

A method and timing recovery circuit for recovering a sampling clock from a serial data stream encoded using Pulse-Amplitude-Modulation applies a filter pattern decoder to detected symbol sequence at more than two adjacent data symbols, particularly to the detected symbol patterns of four adjacent samples ŷ(k−2), ŷ(k−1), ŷ(k), ŷ(k+1), and calculates an estimated phase error e(k).

20 Claims, 3 Drawing Sheets

Figure 4:
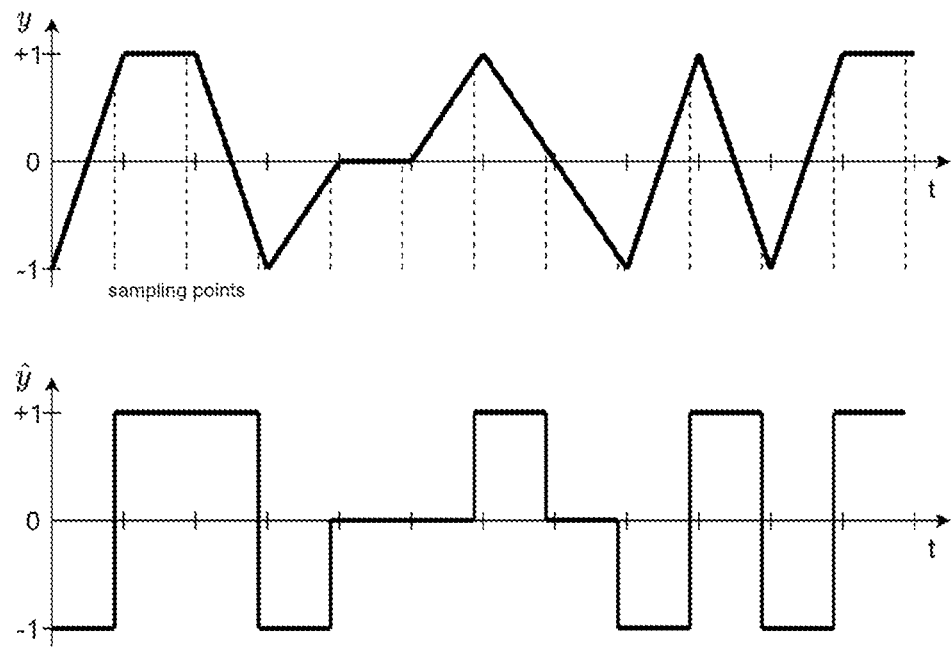

(58) Field of Classification Search
CPC ....... H03L 7/087; H03L 7/0891; H03L 7/145; H03L 7/093; H03L 7/091; H03L 2207/50; H03L 7/097
USPC .......................................... 375/262
See application file for complete search history.

(56) References Cited

U.S. PATENT DOCUMENTS

| | | | |
|---|---|---|---|
| 8,693,596 | B1 | 4/2014 | Warner et al. |
| 9,313,017 | B1* | 4/2016 | Liao ..................... H04L 7/0087 |
| 9,438,409 | B1* | 9/2016 | Liao ..................... H04L 7/0062 |
| 2005/0047500 | A1* | 3/2005 | Gupta ............... H04L 25/03885 375/232 |
| 2009/0224806 | A1 | 9/2009 | Huang et al. |
| 2015/0222419 | A1 | 8/2015 | Bachmann et al. |
| 2017/0171002 | A1 | 6/2017 | Palmer |
| 2018/0241540 | A1 | 8/2018 | Shibasaki |
| 2018/0278405 | A1 | 9/2018 | Yao et al. |
| 2021/0184711 | A1* | 6/2021 | Wang ..................... H04B 1/16 |
| 2021/0218605 | A1* | 7/2021 | Palusa ................... H04L 25/14 |

OTHER PUBLICATIONS

Masum Hossaim et al., "DDJ-Adaptive SAR TDC-Based Timing Recovery for Multilevel Signaling", IEEE Journal of Solid-State Circuits, IEEE, USA, vol. 54, No. 10, Oct. 1, 2019, pp. 2833-2844.
Akihiko Sugiyama et al., "A Fast Timing Recovery Method With a Decision Feedback Equalizer for Baudrate Sampling", IEICE Transactions on Fundamentals of Electronics, Communications and Computer Sciences, Engineering Sciences Society, Tokyo, JP, vol. E79-A, No. 8, Aug. 1, 2996, pp. 1267-1273.
Dongwook Kim et al., "A 12-Gb/s 10-ns Turn-On Time Rapid On/Off Baud-Rate DFE Receiver in 65-nm CMOS", IEEE Journal of Solid-State Circuits, IEEE, USA, vol. 55, No. 8, Mar. 16, 2020, pp. 2196-2205.

* cited by examiner

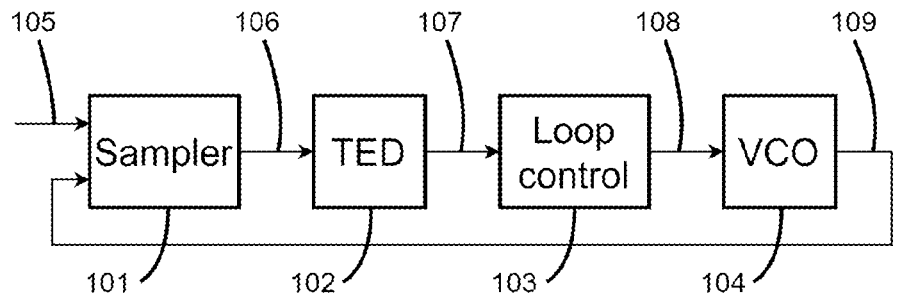
Fig. 1 (State-of the art)
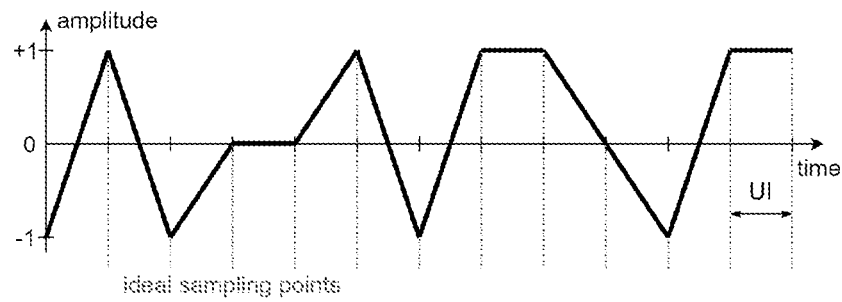
Fig. 2
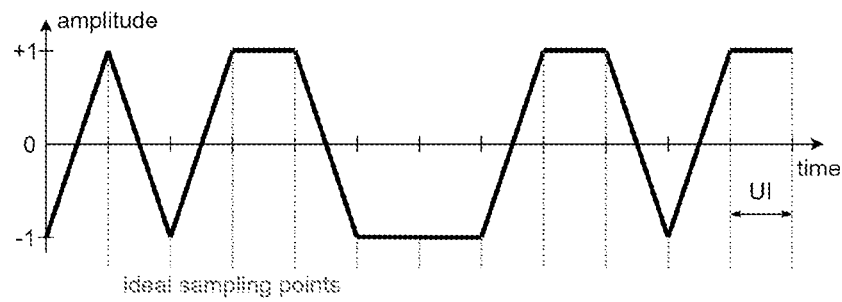
Fig. 3

METHOD AND TIMING RECOVERY CIRCUIT FOR RECOVERING A SAMPLING CLOCK FROM A SERIAL DATA STREAM ENCODED USING PAM

CROSS REFERENCE TO RELATED APPLICATIONS

This application is the National Phase filing under 35 U.S.C. § 371 of International Application No.: PCT/EP2021/071581, filed on Aug. 2, 2021, which claims priority to European Application No.: 20189884.8 filed on Aug. 6, 2020. The contents of this prior application is hereby incorporated by reference herein in its entirety.

The present invention relates to a method for recovering a sampling clock from a serial data stream encoded using Pulse-Amplitude-Modulation scheme with two or three levels per data Unit-Interval. The invention further relates to a timing recovery circuit for recovering a sampling clock from a serial data stream encoded using Pulse-Amplitude-Modulation scheme with two or three levels per data Unit-Interval.

BACKGROUND

The aim of a timing recovery circuit or method is to recover the sampling clock, also known as recovered clock, from serial data stream to optimally sample the receiving data with respect to time. This is necessary because only the data signal is transmitted, but not the transmitter clock signal (e.g. Ethernet examples: 100Base-T1, 1000Base-T1).

The receiving data streams are encoded using Pulse-Amplitude-Modulation (PAM) scheme with 3 (PAM 3) or two (PAM 2) levels.

The Task is to sample the data at the receiver input close to an ideal sampling point, which corresponds to the ideal data position in time within the data Unit-Interval (UI) and quantize the receiving data signal to a multi-bit digital signal, e.g. by means of an Analogue-Digital-Converter (ADC).

Therefore, the task is to detect the timing from a series of received data symbols and to extract the ideal sampling point information.

This is done with a timing recovery circuit or method. A sampling clock signal is generated by a clock generation device which can adjust the sampling clock signal in phase and frequency by a closed control loop. A data sample is taken with this sampling clock signal by a sampling device. The timing error detector (TED) estimates the phase offset of the sample (taken with this sampling clock signal) from the ideal sampling point in receiver circuits. The TED provides the timing recovery loop control with an unambiguous control signal to recover phase and frequency of the sampling clock signal in the receiver.

The timing error detector (TED) can be implemented in different ways:
1) Mueller-Müller TED (U.S. Pat. No. 7,489,749 B2 and U.S. Pat. No. 8,693,596 B1)

The receiving data signal is sampled once per UI by a multi-bit ADC and is then quantized with a slicer. The phase error e(k) is calculated from the ADC output values y(k) and the detected symbols $\hat{y}$(k) from the slicer by applying the following equation: $e(k)=\hat{y}(k-1)*y(k)-\hat{y}(k)*y(k-1)$.

2) Early-Late Detector (US 2017/0171002 A2)

The receiving data signal is sampled twice per UI with a distance of 0.5 UI by a 1-bit ADC. One sample is supposed to be in the center of the data bit, the other one is supposed to sample the data signal on the transition between two adjacent data bits. By comparing these two samples, it can be determined whether the phase of the sampling clock must be shifted to one direction or the other.

3) Gardner TED (US 2015/0222419 A1)

The receiving data signal is sampled twice per UI with a distance of 0.5 UI by a multi-bit ADC. The phase error e(k) is calculated from the ADC output values y(k) by applying the following equation:

$$e(k)=\{y(k)-y(k-1)\}*y(k-0.5).$$

4) Oversampling TED (U.S. Pat. No. 7,149,265 B2)

The receiving data signal is sampled several times per UI with the oversampling ratio (OSR). By applying a dedicated algorithm, the optimal sampling point in time can be distinguished from these several sampling clocks.

Drawbacks of the Existing Solutions:
1) Mueller-Müller TED
   conventional MM-TED is working for PAM-2 signals, but todays ethernet standards use PAM-3 for example,
   only current symbol and the last detected symbol are used to determine the phase offset, this increases the probability of wrong phase adjustment decisions.
2) Early-Late Detector
   two samples per UI are needed (center and on transition),
   second transition sampler consumes power and area.
3) Gardner TED
   two samples per UI are needed,
   second sampler consumes power and area.
4) Oversampling
   oversamples UI with certain OSR,
   small resolution with respect to the possible sample points within one UI,
   multiple samplers consume power and area.

It is an object of the present invention to overcome the disadvantages of the prior art and to provide the timing recovery control loop with an unambiguous control signal to recover phase and frequency of the sampling clock signal in the receiver for PAM-2 and PAM-3 serial data stream and to detect a phase offset from the ideal sampling point while operating only with a single data sample.

SUMMARY OF THE INVENTION

According to the invention the object is solved by a method for recovering a sampling clock from a serial data stream encoded using Pulse-Amplitude-Modulation scheme, comprising the steps of:
   sampling received data signals from the serial data stream by an analog-to-digital converter once per unit-interval using a sampling clock signal provided by a clock generating device providing a timing recovery loop control,
   quantizing the incoming data samples with a slicer as corresponding detected symbols,
   storing adjacent incoming data samples and the corresponding detected symbols to preserve data for phase error estimation,
   applying a digital filter pattern decoder to the current and last detected symbols to determine if this symbol sequence can be used to estimate a phase offset of the sampling clock signal from the ideal sampling point and calculating the estimated phase error depending on the detected symbol pattern of four adjacent samples
   adjusting the phase of the sampling clock signal within the timing recovery loop control using the calculated estimated phase error.

Pursuant to a variant of the invention the serial data stream is encoded using Pulse-Amplitude-Modulation scheme with three levels and the estimated phase error is calculated using an equation according to the following table:

| $\hat{y}(k-2)$ | $\hat{y}(k-1)$ | $\hat{y}(k)$ | $\hat{y}(k+1)$ | $e(k) =$ | note |
|---|---|---|---|---|---|
| +1 | +1 | +1 | 0/−1 | y(k) − y(k − 1) | 2 |
| 0 | +1 | +1 | 0 | y(k) − y(k − 1) | |
| 0 | +1 | +1 | −1 | y(k) − y(k − 1) | |
| −1/0 | +1 | +1 | +1 | y(k) − y(k − 1) | 3 |
| −1 | +1 | +1 | 0 | y(k) − y(k − 1) | |
| −1 | +1 | +1 | −1 | y(k) − y(k − 1) | |
| +1 | +1 | −1 | −1 | y(k) + y(k − 1) | |
| +1 | +1 | −1 | 0/+1 | y(k) + y(k − 1) | 1, 3 |
| 0/−1 | +1 | −1 | −1 | y(k) + y(k − 1) | 1, 2 |
| X | +1 | 0 | −1 | y(k) | |
| +1 | −1 | −1 | 0 | −y(k) + y(k − 1) | |
| +1 | −1 | −1 | +1 | −y(k) + y(k − 1) | |
| 0/+1 | −1 | −1 | −1 | −y(k) + y(k − 1) | 3 |
| 0 | −1 | −1 | 0 | −y(k) + y(k − 1) | |
| 0 | −1 | −1 | +1 | −y(k) + y(k − 1) | |
| −1 | −1 | −1 | 0/+1 | −y(k) + y(k − 1) | 2 |
| −1 | −1 | +1 | +1 | −y(k) − y(k − 1) | |
| −1 | −1 | +1 | 0/−1 | −y(k) − y(k − 1) | 1, 3 |
| 0/+1 | −1 | +1 | +1 | −y(k) − y(k − 1) | 1, 2 |
| X | −1 | 0 | +1 | −y(k) | |
| +1 | 0 | 0 | +1 | −y(k) + y(k − 1) | |
| +1 | 0 | 0 | 0 | −y(k) + y(k − 1) | 3 |
| +1 | 0 | 0 | −1 | y(k) + y(k − 1) | |
| 0 | 0 | 0 | +1 | −y(k) + y(k − 1) | 2 |
| 0 | 0 | 0 | −1 | y(k) − y(k − 1) | 2 |
| −1 | 0 | 0 | +1 | −y(k) − y(k − 1) | |
| −1 | 0 | 0 | 0 | y(k) − y(k − 1) | 3 |
| −1 | 0 | 0 | −1 | y(k) − y(k − 1) | |
| All other combinations | | | | 0 | | wherein note 1 is only applicable if no frequency offset exists, note 2 can only detect late sampling (e(k)<0) and note 3 can only detect early sampling (e(k)>0).

According to an alternative variant of the invention the serial data stream is encoded using Pulse-Amplitude-Modulation scheme with two levels and the estimated phase error is calculated using an equation according to the following table:

| $\hat{y}(k-2)$ | $\hat{y}(k-1)$ | $\hat{y}(k)$ | $\hat{y}(k+1)$ | $e(k) =$ | note |
|---|---|---|---|---|---|
| +1 | +1 | +1 | −1 | y(k) − y(k − 1) | 2 |
| −1 | +1 | +1 | −1 | y(k) − y(k − 1) | |
| −1 | +1 | +1 | +1 | y(k) − y(k − 1) | 3 |
| +1 | +1 | −1 | −1 | y(k) + y(k − 1) | |
| +1 | +1 | −1 | +1 | y(k) + y(k − 1) | 1, 3 |
| −1 | +1 | −1 | −1 | y(k) + y(k − 1) | 1, 2 |
| +1 | −1 | −1 | −1 | −y(k) + y(k − 1) | 3 |
| +1 | −1 | −1 | +1 | −y(k) + y(k − 1) | |
| −1 | −1 | −1 | +1 | −y(k) + y(k − 1) | 2 |
| −1 | −1 | +1 | +1 | −y(k) − y(k − 1) | |
| −1 | −1 | +1 | −1 | −y(k) − y(k − 1) | 1, 3 |
| +1 | −1 | +1 | +1 | −y(k) − y(k − 1) | 1, 2 |
| all other combinations | | | | 0 | | wherein note 1 is only applicable if no frequency offset exists, note 2 can only detect late sampling (e(k)<0) and note 3 can only detect early sampling (e(k)>0).

In an advantageous variant of the invention the method comprises the further step of multiplying the estimated phase error with a weight factor to obtain an error signal.

Pursuant to a variant of the invention the serial data stream is encoded using Pulse-Amplitude-Modulation scheme with three levels and the weight factor is defined in the following table for early and late phase adjustment:

| $\hat{y}(k-2)$ | $\hat{y}(k-1)$ | $\hat{y}(k)$ | $\hat{y}(k+1)$ | $e(k) =$ | early: w | late: w | note |
|---|---|---|---|---|---|---|---|
| +1 | +1 | +1 | 0/−1 | y(k) − y(k − 1) | 0.000 | 0.250 | 2 |
| 0 | +1 | +1 | 0 | y(k) − y(k − 1) | 0.500 | 0.500 | |
| 0 | +1 | +1 | −1 | y(k) − y(k − 1) | 0.250 | 0.250 | |
| −1/0 | +1 | +1 | +1 | y(k) − y(k − 1) | 0.250 | 0.000 | 3 |
| −1 | +1 | +1 | 0 | y(k) − y(k − 1) | 0.250 | 0.250 | |
| −1 | +1 | +1 | −1 | y(k) − y(k − 1) | 0.500 | 0.500 | |
| +1 | +1 | −1 | −1 | y(k) + y(k − 1) | 1.000 | 1.000 | |
| +1 | +1 | −1 | 0/+1 | y(k) + y(k − 1) | 0.125 | 0.125 | 1, 3 |
| 0/−1 | +1 | −1 | −1 | y(k) + y(k − 1) | 0.125 | 0.125 | 1, 2 |
| X | +1 | 0 | −1 | y(k) | 0.125 | 0.125 | |
| +1 | −1 | −1 | 0 | −y(k) + y(k − 1) | 0.250 | 0.250 | |
| +1 | −1 | −1 | +1 | −y(k) + y(k − 1) | 0.500 | 0.500 | |
| 0/+1 | −1 | −1 | −1 | −y(k) + y(k − 1) | 0.250 | 0.000 | 3 |
| 0 | −1 | −1 | 0 | −y(k) + y(k − 1) | 0.500 | 0.500 | |
| 0 | −1 | −1 | +1 | −y(k) + y(k − 1) | 0.250 | 0.250 | |
| −1 | −1 | −1 | 0/+1 | −y(k) + y(k − 1) | 0.000 | 0.250 | 2 |
| −1 | −1 | +1 | +1 | −y(k) − y(k − 1) | 1.000 | 1.000 | |
| −1 | −1 | +1 | 0/−1 | −y(k) − y(k − 1) | 0.125 | 0.125 | 1, 3 |
| 0/+1 | −1 | +1 | +1 | −y(k) − y(k − 1) | 0.125 | 0.125 | 1, 2 |
| X | −1 | 0 | +1 | −y(k) | 0.125 | 0.125 | |
| +1 | 0 | 0 | +1 | −y(k) + y(k − 1) | 0.500 | 0.500 | |
| +1 | 0 | 0 | 0 | −y(k) + y(k − 1) | 0.250 | 0.000 | 3 |
| +1 | 0 | 0 | −1 | y(k) + y(k − 1) | 0.125 | 0.125 | |
| 0 | 0 | 0 | +1 | −y(k) + y(k − 1) | 0.000 | 0.250 | 2 |
| 0 | 0 | 0 | −1 | y(k) − y(k − 1) | 0.000 | 0.250 | 2 |
| −1 | 0 | 0 | +1 | −y(k) − y(k − 1) | 0.125 | 0.125 | |
| −1 | 0 | 0 | 0 | y(k) − y(k − 1) | 0.250 | 0.000 | 3 |
| −1 | 0 | 0 | −1 | y(k) − y(k − 1) | 0.500 | 0.500 | |
| All other combinations | | | | 0 | 0 | 0 | | wherein note 1 is only applicable if no frequency offset exists, note 2 can only detect late sampling (e(k)<0) and note 3 can only detect early sampling (e(k)>0).

According to an alternative variant of the invention the serial data stream is encoded using Pulse-Amplitude-Modulation scheme with two levels and the weight factor is defined in the following table for early and late phase adjustment:

| $\hat{y}(k-2)$ | $\hat{y}(k-1)$ | $\hat{y}(k)$ | $\hat{y}(k+1)$ | $e(k) =$ | early: w | late: w | note |
|---|---|---|---|---|---|---|---|
| +1 | +1 | +1 | −1 | y(k) − y(k − 1) | 0.000 | 0.250 | 2 |
| −1 | +1 | +1 | −1 | y(k) − y(k − 1) | 0.500 | 0.500 | |
| −1 | +1 | +1 | +1 | y(k) − y(k − 1) | 0.250 | 0.000 | 3 |
| +1 | +1 | −1 | −1 | y(k) + y(k − 1) | 1.000 | 1.000 | |
| +1 | +1 | −1 | +1 | y(k) + y(k − 1) | 0.125 | 0.125 | 1, 3 |
| −1 | +1 | −1 | −1 | y(k) + y(k − 1) | 0.125 | 0.125 | 1, 2 |
| +1 | −1 | −1 | −1 | y(k) + y(k − 1) | 0.250 | 0.000 | 3 |
| +1 | −1 | −1 | +1 | y(k) + y(k − 1) | 0.500 | 0.500 | |
| −1 | −1 | −1 | +1 | y(k) + y(k − 1) | 0.000 | 0.250 | 2 |
| −1 | −1 | +1 | +1 | −y(k) − y(k − 1) | 1.000 | 1.000 | |
| −1 | −1 | +1 | −1 | −y(k) − y(k − 1) | 0.125 | 0.125 | 1, 3 |
| +1 | −1 | +1 | +1 | −y(k) − y(k − 1) | 0.125 | 0.125 | 1, 2 |
| all other combinations | | | | 0 | 0 | 0 | | wherein note 1 is only applicable if no frequency offset exists, note 2 can only detect late sampling (e(k)<0) and note 3 can only detect early sampling (e(k)>0).

In a variant of the invention the method further comprises the step of filtering the data samples before the step of quantizing the data samples. Pursuant to a variant of the invention the filtering is performed by a Feed-Forward Equalizer and/or a Decision Feedback Equalizer. The filtering improves the signal to noise ration or compensates for channel characteristics, e.g. inter symbol interference.

According to a variant of the invention the method comprises the step of adjusting the weights for different states during the initialization procedure of the timing recovery. For example, the weights can be decreased, when the timing recovery is locked.

In an advantageous variant of the invention the method comprises the step of applying the error signal to a bang-bang-detector with adjustable threshold and 3-point control output to quantize the calculated estimated phase error and adjust it to the bit width of the control signal.

Pursuant to a variant of the invention the calculated estimated phase error is quantized by n-Bit.

The object is furthermore solved by a timing recovery circuit for recovering a sampling clock from a serial data stream encoded using Pulse-Amplitude-Modulation scheme, comprising:

an analog-to-digital converter for sampling received data signals from the serial data stream once per unit-interval using a sampling clock signal provided by a clock generating device providing a timing recovery loop control, a slicer for quantizing the incoming data samples as corresponding detected symbols, a register for storing adjacent incoming data samples and the corresponding detected symbols to preserve data for phase error estimation, a digital timing error detector for applying a digital filter pattern decoder to the current and last detected symbols to determine if this symbol sequence can be used to estimate a phase offset of the sampling clock signal from the ideal sampling point and for calculating the estimated phase error depending on the detected symbol pattern of four adjacent samples adjusting the phase of the sampling clock signal within the timing recovery loop control using the calculated estimated phase error.

Pursuant to a variant of the invention the serial data stream is encoded using Pulse-Amplitude-Modulation scheme with three levels and the estimated phase error is calculated using an equation according to the following table:

| $\hat{y}(k-2)$ | $\hat{y}(k-1)$ | $\hat{y}(k)$ | $\hat{y}(k+1)$ | $e(k) =$ | note |
|---|---|---|---|---|---|
| +1 | +1 | +1 | 0/−1 | $y(k) - y(k-1)$ | 2 |
| 0 | +1 | +1 | 0 | $y(k) - y(k-1)$ | |
| 0 | +1 | +1 | −1 | $y(k) - y(k-1)$ | |
| −1/0 | +1 | +1 | +1 | $y(k) - y(k-1)$ | 3 |
| −1 | +1 | +1 | 0 | $y(k) - y(k-1)$ | |
| −1 | +1 | +1 | −1 | $y(k) - y(k-1)$ | |
| +1 | +1 | −1 | −1 | $y(k) + y(k-1)$ | |
| +1 | +1 | −1 | 0/+1 | $y(k) + y(k-1)$ | 1, 3 |
| 0/−1 | +1 | −1 | −1 | $y(k) + y(k-1)$ | 1, 2 |
| X | +1 | 0 | −1 | $y(k)$ | |
| +1 | −1 | −1 | 0 | $-y(k) + y(k-1)$ | |
| +1 | −1 | −1 | +1 | $-y(k) + y(k-1)$ | |
| 0/+1 | −1 | −1 | −1 | $-y(k) + y(k-1)$ | 3 |
| 0 | −1 | −1 | 0 | $-y(k) + y(k-1)$ | |
| 0 | −1 | −1 | +1 | $-y(k) + y(k-1)$ | |
| −1 | −1 | −1 | 0/+1 | $-y(k) + y(k-1)$ | 2 |
| −1 | −1 | +1 | +1 | $-y(k) - y(k-1)$ | |
| −1 | −1 | +1 | 0/−1 | $-y(k) - y(k-1)$ | 1, 3 |
| 0/+1 | −1 | +1 | +1 | $-y(k) - y(k-1)$ | 1, 2 |
| X | −1 | 0 | +1 | $-y(k)$ | |
| +1 | 0 | 0 | +1 | $-y(k) + y(k-1)$ | |
| +1 | 0 | 0 | 0 | $-y(k) + y(k-1)$ | 3 |
| +1 | 0 | 0 | −1 | $y(k) + y(k-1)$ | |
| 0 | 0 | 0 | +1 | $-y(k) + y(k-1)$ | 2 |
| 0 | 0 | 0 | −1 | $y(k) - y(k-1)$ | 2 |
| −1 | 0 | 0 | +1 | $-y(k) + y(k-1)$ | |
| −1 | 0 | 0 | 0 | $y(k) - y(k-1)$ | 3 |
| −1 | 0 | 0 | −1 | $y(k) - y(k-1)$ | |
| All other combinations | | | | 0 | | wherein note 1 is only applicable if no frequency offset exists, note 2 can only detect late sampling ($e(k)<0$) and note 3 can only detect early sampling ($e(k)>0$).

According to an alternative variant of the invention the serial data stream is encoded using Pulse-Amplitude-Modulation scheme with two levels and the estimated phase error is calculated using an equation according to the following table:

| $\hat{y}(k-2)$ | $\hat{y}(k-1)$ | $\hat{y}(k)$ | $\hat{y}(k+1)$ | $e(k) =$ | note |
|---|---|---|---|---|---|
| +1 | +1 | +1 | −1 | $y(k) - y(k-1)$ | 2 |
| −1 | +1 | +1 | −1 | $y(k) - y(k-1)$ | |
| −1 | +1 | +1 | +1 | $y(k) - y(k-1)$ | 3 |
| +1 | +1 | −1 | −1 | $y(k) + y(k-1)$ | |
| +1 | +1 | −1 | +1 | $y(k) + y(k-1)$ | 1, 3 |
| −1 | +1 | −1 | −1 | $y(k) + y(k-1)$ | 1, 2 |
| +1 | −1 | −1 | +1 | $-y(k) + y(k-1)$ | |
| +1 | −1 | −1 | +1 | $-y(k) + y(k-1)$ | |
| −1 | −1 | −1 | +1 | $-y(k) + y(k-1)$ | 2 |
| −1 | −1 | +1 | +1 | $-y(k) - y(k-1)$ | |
| −1 | −1 | +1 | −1 | $-y(k) - y(k-1)$ | 1, 3 |
| +1 | −1 | +1 | +1 | $-y(k) - y(k-1)$ | 1, 2 |
| all other combinations | | | | 0 | | wherein note 1 is only applicable if no frequency offset exists, note 2 can only detect late sampling ($e(k)<0$) and note 3 can only detect early sampling ($e(k)>0$).

In an advantageous variant of the invention the timing recovery circuit multiplies calculated the estimated phase error with a weight factor to obtain an error signal.

Pursuant to a variant of the invention the serial data stream is encoded using Pulse-Amplitude-Modulation scheme with three levels and the weight factor is defined in the following table for early and late phase adjustment:

| $\hat{y}(k-2)$ | $\hat{y}(k-1)$ | $\hat{y}(k)$ | $\hat{y}(k+1)$ | $e(k) =$ | early: w | late: w | note |
|---|---|---|---|---|---|---|---|
| +1 | +1 | +1 | 0/−1 | $y(k) - y(k-1)$ | 0.000 | 0.250 | 2 |
| 0 | +1 | +1 | 0 | $y(k) - y(k-1)$ | 0.500 | 0.500 | |
| 0 | +1 | +1 | −1 | $y(k) - y(k-1)$ | 0.250 | 0.250 | |
| −1/0 | +1 | +1 | +1 | $y(k) - y(k-1)$ | 0.250 | 0.000 | 3 |
| −1 | +1 | +1 | 0 | $y(k) - y(k-1)$ | 0.250 | 0.250 | |
| −1 | +1 | +1 | −1 | $y(k) - y(k-1)$ | 0.500 | 0.500 | |
| +1 | +1 | −1 | −1 | $y(k) + y(k-1)$ | 1.000 | 1.000 | |
| +1 | +1 | −1 | 0/+1 | $y(k) + y(k-1)$ | 0.125 | 0.125 | 1, 3 |
| 0/−1 | +1 | −1 | −1 | $y(k) + y(k-1)$ | 0.125 | 0.125 | 1, 2 |
| X | +1 | 0 | −1 | $y(k)$ | 0.125 | 0.125 | |
| +1 | −1 | −1 | 0 | $-y(k) + y(k-1)$ | 0.250 | 0.250 | |
| +1 | −1 | −1 | +1 | $-y(k) + y(k-1)$ | 0.500 | 0.500 | |
| 0/+1 | −1 | −1 | −1 | $-y(k) + y(k-1)$ | 0.250 | 0.000 | 3 |
| 0 | −1 | −1 | 0 | $-y(k) + y(k-1)$ | 0.500 | 0.500 | |
| 0 | −1 | −1 | +1 | $-y(k) + y(k-1)$ | 0.250 | 0.250 | |
| −1 | −1 | −1 | 0/+1 | $-y(k) + y(k-1)$ | 0.000 | 0.250 | 2 |
| −1 | −1 | +1 | +1 | $-y(k) - y(k-1)$ | 1.000 | 1.000 | |
| −1 | −1 | +1 | 0/−1 | $-y(k) - y(k-1)$ | 0.125 | 0.125 | 1, 3 |
| 0/+1 | −1 | +1 | +1 | $-y(k) - y(k-1)$ | 0.125 | 0.125 | 1, 2 |
| X | −1 | 0 | +1 | $-y(k)$ | 0.125 | 0.125 | |
| +1 | 0 | 0 | +1 | $-y(k) + y(k-1)$ | 0.500 | 0.500 | |
| +1 | 0 | 0 | 0 | $-y(k) + y(k-1)$ | 0.250 | 0.000 | 3 |
| +1 | 0 | 0 | −1 | $y(k) + y(k-1)$ | 0.125 | 0.125 | |
| 0 | 0 | 0 | +1 | $-y(k) + y(k-1)$ | 0.000 | 0.250 | 2 |
| 0 | 0 | 0 | −1 | $y(k) - y(k-1)$ | 0.000 | 0.250 | 2 |
| −1 | 0 | 0 | +1 | $-y(k) + y(k-1)$ | 0.125 | 0.125 | |
| −1 | 0 | 0 | 0 | $y(k) - y(k-1)$ | 0.250 | 0.000 | 3 |
| −1 | 0 | 0 | −1 | $y(k) - y(k-1)$ | 0.500 | 0.500 | |
| All other combinations | | | | 0 | 0 | 0 | | wherein note 1 is only applicable if no frequency offset exists, note 2 can only detect late sampling ($e(k)<0$) and note 3 can only detect early sampling ($e(k)>0$).

According to an alternative variant of the invention the serial data stream is encoded using Pulse-Amplitude-Modulation scheme with two levels and the weight factor is defined in the following table for early and late phase adjustment:

| $\hat{y}(k-2)$ | $\hat{y}(k-1)$ | $\hat{y}(k)$ | $\hat{y}(k+1)$ | e(k) = | early: w | late: w | note |
|---|---|---|---|---|---|---|---|
| +1 | +1 | +1 | −1 | y(k) − y(k − 1) | 0.000 | 0.250 | 2 |
| −1 | +1 | +1 | −1 | y(k) − y(k − 1) | 0.500 | 0.500 | |
| −1 | +1 | +1 | +1 | y(k) − y(k − 1) | 0.250 | 0.000 | 3 |
| +1 | +1 | −1 | −1 | y(k) + y(k − 1) | 1.000 | 1.000 | |
| +1 | +1 | −1 | +1 | y(k) + y(k − 1) | 0.125 | 0.125 | 1, 3 |
| −1 | +1 | −1 | +1 | y(k) + y(k − 1) | 0.125 | 0.125 | 1, 2 |
| +1 | −1 | −1 | −1 | −y(k) + y(k − 1) | 0.250 | 0.000 | 3 |
| +1 | −1 | −1 | +1 | −y(k) + y(k − 1) | 0.500 | 0.500 | |
| −1 | −1 | −1 | +1 | −y(k) + y(k − 1) | 0.000 | 0.250 | 2 |
| −1 | −1 | +1 | +1 | −y(k) − y(k − 1) | 1.000 | 1.000 | |
| −1 | −1 | +1 | −1 | −y(k) − y(k − 1) | 0.125 | 0.125 | 1, 3 |
| +1 | −1 | +1 | +1 | −y(k) − y(k − 1) | 0.125 | 0.125 | 1, 2 |
| all other combinations | | | | 0 | 0 | 0 | | wherein note 1 is only applicable if no frequency offset exists, note 2 can only detect late sampling (e(k)<0) and note 3 can only detect early sampling (e(k)>0).

In a variant of the invention the timing recovery circuit further comprises a digital filter for filtering the data samples before the step of quantizing the data samples. Pursuant to a variant of the invention the digital filter is a Feed-Forward Equalizer and/or a Decision Feedback Equalizer. The filtering improves the signal to noise ration or compensates for channel characteristics, e.g. inter symbol interference.

According to a variant of the invention the timing recovery circuits adjusts the weights of the digital timing error detector for different states during the initialization procedure of the timing recovery.

In an advantageous variant of the invention the timing recovery circuit comprises a bang-bang-detector with adjustable threshold and 3-point control output to quantize the calculated estimated phase error and adjust it to the bit width of the control signal.

According to a variant of the invention the calculated estimated phase error is quantized by n-Bit.

BRIEF DESCRIPTION OF THE DRAWING FIGURES

Figure 5:
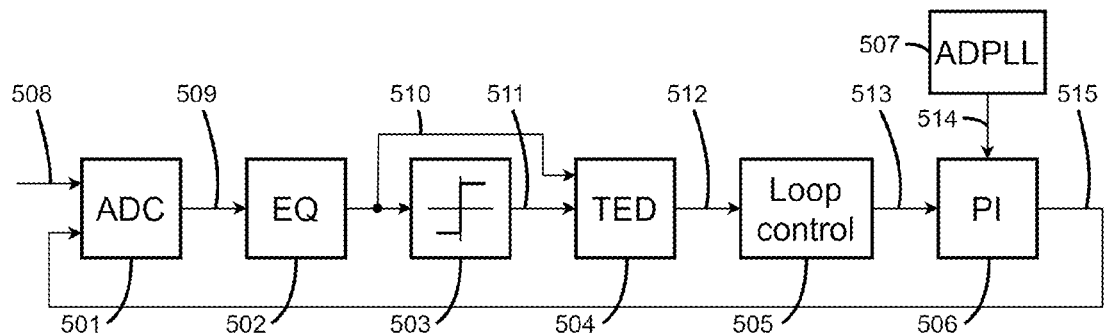
Figure 6:
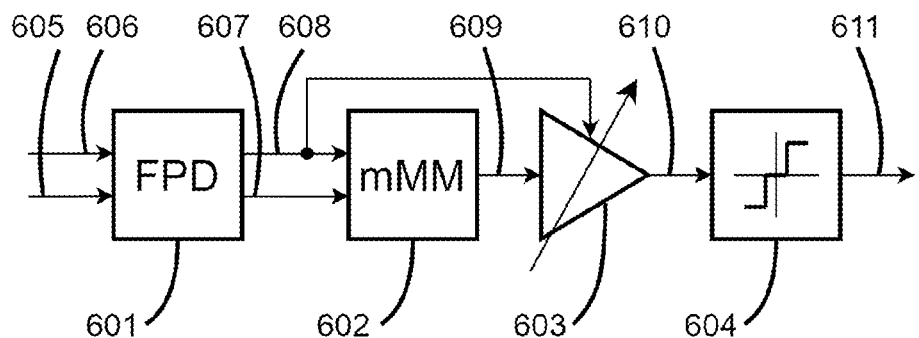
Figure 7:
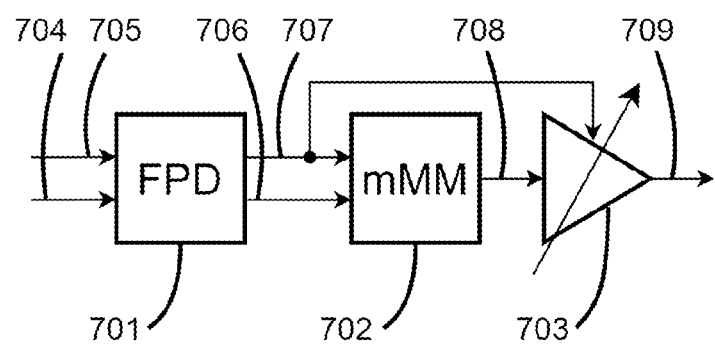

In the following the invention will be further explained with reference to the embodiments shown in the figures. It shows:

FIG. 1 a block diagram of a timing recovery circuit according to the state of the art, FIG. 2 a PAM-3 signal with ideal sampling points, FIG. 3 a PAM-2 signal with ideal sampling points, FIG. 4 a PAM-3 signal with early sampling and corresponding detected symbols, FIG. 5 a block diagram of a timing recovery circuit according to the invention, FIG. 6 a block diagram of an embodiment of a timing error detector with quantizer, and FIG. 7 a block diagram of another embodiment of a timing error detector.

DETAILED DESCRIPTION

FIG. 1 shows a block diagram of a timing recovery circuit according to the state of the art. According to FIG. 1 a sampling clock signal 109 is generated by a clock generation device 104 which can adjust the sampling clock signal 109 in phase and frequency by a closed control loop. A data sample 106 is taken with this sampling clock signal 109 by a sampling device 101. The timing error detector (TED) 102 estimates the phase offset of the sample 106 (taken with this sampling clock signal 109) from the ideal sampling point in receiver circuits. The TED 102 provides the timing recovery loop control 103 with an unambiguous control signal 107 to recover phase and frequency of the sampling clock signal 109 in the receiver. The TED can be implemented in different ways using the above-mentioned Mueller-Müller TED, Early-Late Detector, Gardner TED or Oversampling TED.

FIG. 2 shows a PAM-3 signal with ideal sampling points, FIG. 3 a PAM-2 signal with ideal sampling points and FIG. 4 a PAM-3 signal with early sampling and corresponding detected symbols $\hat{y}(k)$.

FIG. 5 shows a block diagram of a timing recovery circuit according to the invention. The block diagram of FIG. 5 presents the part of the receiver front-end which is responsible for sampling of the receiving data signal and the adjustment of the sampling point. The TED is depicted in detail in FIG. 6.

A series of adjacent incoming data samples (ADC output values y(k) 509,606) and the corresponding detected symbol $\hat{y}(k)$ 511,605 are stored in registers to preserve data for phase error estimation.

The ADC output values y(k) 509 can be optionally processed by a digital filter (like a Feed-Forward Equalizer FFE and/or a Decision Feedback Equalizer DFE) to improve the signal to noise ration or to compensate for channel characteristics 510, e.g. inter symbol interference.

In each time step k, a digital filter pattern decoder is applied to the current and last symbols to determine if this symbol sequence can be used to estimate the phase offset of the sampling clock signal from the ideal sampling point.

Depending on to the detected symbol pattern of four adjacent samples 608, the estimated phase error is calculated using an equation, implemented in a digital timing error detector TED, as summarized in Table 1 below.

An example of incorrect sampling is represented in FIG. 4.

The equation in Table 1 is a modified version of the Mueller-Müller (MM) algorithm 602. Mueller-Müller only considers two adjacent symbols to estimate the phase error, this invention considers more than two. When applying Mueller-Müller, wrong decisions can be made. At symbol sequences, that cannot be used to derive an unambiguous control signal, no phase correction decision is made in this invention. When applied to PAM-3 signals this method takes advantage of double zero symbols $\hat{y}(k-1)=\hat{y}(k)=0$. That means in total 32 out of 81 symbol sequences can be utilized to estimate the phase error value.

Without any frequency offset, 8 more symbol sequences can be utilized for the phase error estimation of a PAM-2 or PAM-3 serial data stream.

If the proposed scheme from Table 1 is not applied, only 54 out of 81 symbol sequences can be used, since 17 sequences contain double zero symbols, whereas 2 of 54 give zero as result and another 28 of 54 could give a faulty error value e(k).

This error signal e(k) 609 is multiplied with a weight factor w depending on the symbol sequence to obtain the error signal 610 e*(k)=w*e(k). The pattern dependent weights w are shown in Table 1.

There are different weights w for early and late phase adjustment. This has the benefit to increase/decrease the sensitivity to certain data symbol sequences.

The pattern dependent weights w can be optionally adjusted for different states during the initialization procedure of the timing recovery. The timing recovery contains a Finite-State-Machine (FSM) that controls the timing recovery control loop during the initialization procedure. The two main states are lock-in and locked. The FSM is also capable of changing the pattern dependent weights w according to the current state of the lock-in procedure, e.g. the weights can be increased, when the timing recovery is in the lock-in state, or the weights can be decreased, when the timing recovery is locked.

The phase error e*(k) 610 is used to adjust the phase of the sampling clock signal within the timing recovery control loop.

The phase error e*(k) is optionally applied to a bang-bang-detector with adjustable threshold and 3-point control output 604 to quantize the error signal and therefore adjust it to the bit width of the control signal 611.

The phase error e*(k) is optionally quantized by n-Bit.

FIG. 7 shows a block diagram of another embodiment of a timing error detector. The TED shown in FIG. 6 comprises an optional quantizer, while the TED in FIG. 7 is shown without a quantizer The method according to the invention is applicable to PAM-2 signals. In this case 8 symbol sequences out of 16 can be used to estimate the error signal e(k) (Table 2).

Without any frequency offset, 4 more symbol sequences can be utilized for the phase error estimation. If the proposed scheme from Table 2 is not applied, then 16 out of 16 symbol sequences would be used for phase error estimation, but 2 of 16 give zero as result and another 6 of 16 could result in a faulty error value e(k).

The invention mainly refers to:

Apply a filter pattern decoder to detected symbol sequence at more than two adjacent data symbols. Especially to the detected symbol patterns of four adjacent samples $\hat{y}(k-2)$, $\hat{y}(k-1)$, $\hat{y}(k)$, $\hat{y}(k+1)$, utilize the formula in Table 1 to estimate the phase error e(k);

This error signal e(k) is multiplied with a weight factor depending on the symbol sequence to obtain the weighted error signal e*(k)=w*e(k);

The weighted error signal e*(k) is quantized and used to adjust the phase of the sampling clock signal within the timing recovery control loop.

TABLE 1

Error estimation of PAM-3 input signal (y(k): received multi-bit value; ŷ(k): detected symbol of signal value y(k) ; all other 4-bit sequences result in e(k) = 0)

| ŷ(k − 2) | ŷ(k − 1) | ŷ(k) | ŷ(k + 1) | e(k) = | early: w | late: w | note |
|---|---|---|---|---|---|---|---|
| +1 | +1 | +1 | 0/−1 | y(k) − y(k − 1) | 0.000 | 0.250 | 2 |
| 0 | +1 | +1 | 0 | y(k) − y(k − 1) | 0.500 | 0.500 | |
| 0 | +1 | +1 | −1 | y(k) − y(k − 1) | 0.250 | 0.250 | |
| −1/0 | +1 | +1 | +1 | y(k) − y(k − 1) | 0.250 | 0.000 | 3 |
| −1 | +1 | +1 | 0 | y(k) − y(k − 1) | 0.250 | 0.250 | |
| −1 | +1 | +1 | −1 | y(k) − y(k − 1) | 0.500 | 0.500 | |
| +1 | +1 | −1 | −1 | y(k) + y(k − 1) | 1.000 | 1.000 | |
| +1 | +1 | −1 | 0/+1 | y(k) + y(k − 1) | 0.125 | 0.125 | 1, 3 |
| 0/−1 | +1 | −1 | −1 | y(k) + y(k − 1) | 0.125 | 0.125 | 1, 2 |
| X | +1 | 0 | −1 | y(k) | 0.125 | 0.125 | |
| +1 | −1 | −1 | 0 | −y(k) + y(k − 1) | 0.250 | 0.250 | |
| +1 | −1 | −1 | +1 | −y(k) + y(k − 1) | 0.500 | 0.500 | |
| 0/+1 | −1 | −1 | −1 | −y(k) + y(k − 1) | 0.250 | 0.000 | 3 |
| 0 | −1 | −1 | 0 | −y(k) + y(k − 1) | 0.500 | 0.500 | |
| 0 | −1 | −1 | +1 | −y(k) + y(k − 1) | 0.250 | 0.250 | |
| −1 | −1 | −1 | 0/+1 | −y(k) + y(k − 1) | 0.000 | 0.250 | 2 |
| −1 | −1 | +1 | +1 | −y(k) − y(k − 1) | 1.000 | 1.000 | |
| −1 | −1 | +1 | 0/−1 | −y(k) − y(k − 1) | 0.125 | 0.125 | 1, 3 |
| 0/+1 | −1 | +1 | +1 | −y(k) − y(k − 1) | 0.125 | 0.125 | 1, 2 |
| X | −1 | 0 | +1 | −y(k) | 0.125 | 0.125 | |

TABLE 1-continued

Error estimation of PAM-3 input signal (y(k): received multi-bit value; ŷ(k): detected symbol of signal value y(k) ; all other 4-bit sequences result in e(k) = 0)

| ŷ(k − 2) | ŷ(k − 1) | ŷ(k) | ŷ(k + 1) | e(k) = | early: w | late: w | note |
|---|---|---|---|---|---|---|---|
| +1 | 0 | 0 | +1 | −y(k) + y(k − 1) | 0.500 | 0.500 | |
| +1 | 0 | 0 | 0 | −y(k) + y(k − 1) | 0.250 | 0.000 | 3 |
| +1 | 0 | 0 | −1 | y(k) + y(k − 1) | 0.125 | 0.125 | |
| 0 | 0 | 0 | +1 | −y(k) + y(k − 1) | 0.000 | 0.250 | 2 |
| 0 | 0 | 0 | −1 | y(k) − y(k − 1) | 0.000 | 0.250 | 2 |
| −1 | 0 | 0 | +1 | −y(k) − y(k − 1) | 0.125 | 0.125 | |
| −1 | 0 | 0 | 0 | y(k) − y(k − 1) | 0.250 | 0.000 | 3 |
| −1 | 0 | 0 | −1 | y(k) − y(k − 1) | 0.500 | 0.500 | |
| All other combinations | | | | 0 | 0 | 0 | |

Note:
1 only applicable if no frequency offset exists
2 can only detect late sampling; e(k) < 0
3 can only detect early sampling; e(k) > 0

TABLE 2

Error estimation of PAM-2 input signal (y(k): received multi-bit value; ŷ(k): detected symbol of signal value y(k) ; all other 4-bit sequences result in e(k) = 0)

| ŷ(k − 2) | ŷ(k − 1) | ŷ(k) | ŷ(k + 1) | e(k) = | early: w | late: w | note |
|---|---|---|---|---|---|---|---|
| +1 | +1 | +1 | −1 | y(k) − y(k − 1) | 0.000 | 0.250 | 2 |
| −1 | +1 | +1 | −1 | y(k) − y(k − 1) | 0.500 | 0.500 | |
| −1 | +1 | +1 | +1 | y(k) − y(k − 1) | 0.250 | 0.000 | 3 |
| +1 | +1 | −1 | −1 | y(k) + y(k − 1) | 1.000 | 1.000 | |
| +1 | +1 | −1 | +1 | y(k) + y(k − 1) | 0.125 | 0.125 | 1, 3 |
| −1 | +1 | −1 | −1 | y(k) + y(k − 1) | 0.125 | 0.125 | 1, 2 |
| +1 | −1 | −1 | −1 | −y(k) + y(k − 1) | 0.250 | 0.000 | 3 |
| +1 | −1 | −1 | +1 | −y(k) + y(k − 1) | 0.500 | 0.500 | |
| −1 | −1 | −1 | +1 | −y(k) + y(k − 1) | 0.000 | 0.250 | 2 |
| −1 | −1 | +1 | +1 | −y(k) − y(k − 1) | 1.000 | 1.000 | |
| −1 | −1 | +1 | −1 | −y(k) − y(k − 1) | 0.125 | 0.125 | 1, 3 |
| +1 | −1 | +1 | +1 | −y(k) − y(k − 1) | 0.125 | 0.125 | 1, 2 |
| all other combinations | | | | 0 | 0 | 0 | | note
1 only applicable if no frequency offset exists
2 can only detect late sampling; e(k) < 0
3 can only detect early sampling; e(k) > 0

LIST OF REFERENCE NUMERALS

101 Sampler, e.g. analog-to-digital converter (ADC)
102 Timing Error Detector (TED)
103 Timing Recovery Loop control
104 Voltage Controlled Oscillator (VCO)
105 Received analog data signal
106 Sampled data signal
107 Error signal
108 VCO control signal
109 Sampling control signal
501 Analog to Digital Converter (sampler)
502 Equalizer
503 Slicer
504 Timing Error Detector
505 Timing recovery loop control
506 Phase Interpolator
507 All-Digital Phase Lock Loop
508 Receiving data signal
509 Sampled and quantized data signal
510 Equalized data signal y(k)
511 Detected data symbol ŷ(k)
512 Quantized Error signal 513 PI control signals
514 DCO clock
515 Sampling clock
601 Filter Pattern Decoder (FPD)
602 Modified Mueller-Müller algorithm
603 Error weighting
604 Optional: Quantizer, e.g. 3-point (or more) bang-bang-detector
605 Detected data symbol ŷ(k) (slicer output)
606 Received data signal y(k) (optionally filtered by equalizer)
607 Current and registered data signals y(k), y(k−1), which correspond to data symbols ŷ(k) and ŷ(k−1), respectively
608 Detected data symbols: ŷ(k−2), ŷ(k−1), ŷ(k), ŷ(k+1), which satisfy pattern in
609 Error signal e*(k)
610 Weighted error signal: e*(k)
611 Optional: Quantized error signal: e.g. up/down)
701 Filter Pattern Decoder (FPD)
702 Modified Mueller-Müller algorithm
703 Error weighting
704 Detected data symbol ŷ(k) (slicer output)
705 Received data signal y(k) (optionally filtered by equalizer)
706 Current and registered data signals y(k), y(k−1), which correspond to data symbols ŷ(k) and ȳ(k−1), respectively
707 Detected data symbols: ŷ(k−2), ŷ(k−1), ŷ(k), ŷ(k+1), which satisfy pattern in
708 Error signal e(k)
709 Weighted error signal: e*(k)

The invention claimed is:

1. A method for recovering a sampling clock from a serial data stream encoded using Pulse-Amplitude-Modulation scheme, comprising the steps of:
   sampling received data signals from the serial data stream by an analog-to-digital converter once per unit-interval using a sampling clock signal provided by a clock generating device providing a timing recovery loop control,
   quantizing an incoming data samples with a slicer as corresponding detected symbols,
   storing adjacent incoming data samples and the corresponding detected symbols to preserve data for phase error estimation,
   applying a digital filter pattern decoder to a current and last detected symbols to determine if the sequence of current and last detected symbols can be used to estimate a phase offset of the sampling clock signal from an ideal sampling point and calculating the estimated phase error depending on a detected symbol pattern of four adjacent samples,
   adjusting the phase of the sampling clock signal within the timing recovery loop control using the calculated estimated phase error, and
   multiplying the estimated phase error with a weight factor to obtain an error signal.

2. The method according to claim 1, wherein the serial data stream is encoded using Pulse-Amplitude-Modulation scheme with three levels and the estimated phase error is calculated using an equation according to the following table:

| ŷ(k−2) | ŷ(k−1) | ŷ(k) | ŷ(k+1) | e(k) = | note |
|---|---|---|---|---|---|
| +1 | +1 | +1 | 0/−1 | y(k) − y(k−1) | 2 |
| 0 | +1 | +1 | 0 | y(k) − y(k−1) | |
| 0 | +1 | +1 | −1 | y(k) − y(k−1) | |
| −1/0 | +1 | +1 | +1 | y(k) − y(k−1) | 3 |
| −1 | +1 | +1 | 0 | y(k) − y(k−1) | |
| −1 | +1 | +1 | −1 | y(k) − y(k−1) | |
| +1 | +1 | −1 | −1 | y(k) + y(k−1) | |
| +1 | +1 | −1 | 0/+1 | y(k) + y(k−1) | 1, 3 |
| 0/−1 | +1 | −1 | −1 | y(k) + y(k−1) | 1, 2 |
| X | +1 | 0 | −1 | y(k) | |
| +1 | −1 | −1 | 0 | −y(k) + y(k−1) | |
| +1 | −1 | −1 | +1 | −y(k) + y(k−1) | |
| 0/+1 | −1 | −1 | −1 | −y(k) + y(k−1) | 3 |
| 0 | −1 | −1 | 0 | −y(k) + y(k−1) | |
| 0 | −1 | −1 | +1 | −y(k) + y(k−1) | |
| −1 | −1 | −1 | 0/+1 | −y(k) + y(k−1) | 2 |
| −1 | −1 | +1 | +1 | −y(k) − y(k−1) | |
| −1 | −1 | +1 | 0/−1 | −y(k) − y(k−1) | 1, 3 |
| 0/+1 | −1 | +1 | +1 | −y(k) − y(k−1) | 1, 2 |
| X | −1 | 0 | +1 | −y(k) | |
| +1 | 0 | 0 | +1 | −y(k) + y(k−1) | |
| +1 | 0 | 0 | 0 | −y(k) + y(k−1) | 3 |
| +1 | 0 | 0 | −1 | y(k) + y(k−1) | |
| 0 | 0 | 0 | +1 | −y(k) + y(k−1) | 2 |
| 0 | 0 | 0 | −1 | y(k) − y(k−1) | 2 |
| −1 | 0 | 0 | +1 | −y(k) − y(k−1) | |
| −1 | 0 | 0 | 0 | y(k) − y(k−1) | 3 |
| −1 | 0 | 0 | −1 | y(k) − y(k−1) | |
| All other combinations | | | | 0 | | wherein note 1 is only applicable if no frequency offset exists, note 2 can only detect late sampling (e(k)<0) and note 3 can only detect early sampling (e(k)>0).

3. The method according to claim 1, wherein the serial data stream is encoded using Pulse-Amplitude-Modulation scheme with two levels and the estimated phase error is calculated using an equation according to the following table:

| ŷ(k−2) | ŷ(k−1) | ŷ(k) | ŷ(k+1) | e(k) = | note |
|---|---|---|---|---|---|
| +1 | +1 | +1 | −1 | y(k) − y(k−1) | 2 |
| −1 | +1 | +1 | −1 | y(k) − y(k−1) | |
| −1 | +1 | +1 | +1 | y(k) − y(k−1) | 3 |
| +1 | +1 | −1 | −1 | y(k) + y(k−1) | |
| +1 | +1 | −1 | +1 | y(k) + y(k−1) | 1, 3 |
| −1 | +1 | −1 | −1 | y(k) + y(k−1) | 1, 2 |
| +1 | −1 | −1 | +1 | −y(k) + y(k−1) | 3 |
| +1 | −1 | −1 | −1 | −y(k) + y(k−1) | |
| −1 | −1 | −1 | +1 | −y(k) + y(k−1) | 2 |
| −1 | −1 | +1 | +1 | −y(k) − y(k−1) | |
| −1 | −1 | +1 | −1 | −y(k) − y(k−1) | 1, 3 |
| +1 | −1 | +1 | +1 | −y(k) − y(k−1) | 1, 2 |
| all other combinations | | | | 0 | | wherein note 1 is only applicable if no frequency offset exists, note 2 can only detect late sampling (e(k)<0) and note 3 can only detect early sampling (e(k)>0).

4. The method according to claim 1, wherein the serial data stream is encoded using Pulse-Amplitude-Modulation scheme with three levels and the weight factor is defined in the following table for early and late phase adjustment:

| ŷ(k−2) | ŷ(k−1) | ŷ(k) | ŷ(k+1) | e(k) = | early: w | late: w | note |
|---|---|---|---|---|---|---|---|
| +1 | +1 | +1 | 0/−1 | y(k) − y(k−1) | 0.000 | 0.250 | 2 |
| 0 | +1 | +1 | 0 | y(k) − y(k−1) | 0.500 | 0.500 | |
| 0 | +1 | +1 | −1 | y(k) − y(k−1) | 0.250 | 0.250 | |
| −1/0 | +1 | +1 | +1 | y(k) − y(k−1) | 0.250 | 0.000 | 3 |

-continued

| ŷ(k − 2) | ŷ(k − 1) | ŷ(k) | ŷ(k + 1) | e(k) = | early: w | late: w | note |
|---|---|---|---|---|---|---|---|
| −1 | +1 | +1 | 0 | y(k) − y(k − 1) | 0.250 | 0.250 | |
| −1 | +1 | +1 | −1 | y(k) − y(k − 1) | 0.500 | 0.500 | |
| +1 | +1 | −1 | −1 | y(k) + y(k − 1) | 1.000 | 1.000 | |
| +1 | +1 | −1 | 0/+1 | y(k) + y(k − 1) | 0.125 | 0.125 | 1, 3 |
| 0/−1 | +1 | −1 | −1 | y(k) + y(k − 1) | 0.125 | 0.125 | 1, 2 |
| X | +1 | 0 | −1 | y(k) | 0.125 | 0.125 | |
| +1 | −1 | −1 | 0 | −y(k) + y(k − 1) | 0.250 | 0.250 | |
| +1 | −1 | −1 | +1 | −y(k) + y(k − 1) | 0.500 | 0.500 | |
| 0/+1 | −1 | −1 | −1 | −y(k) + y(k − 1) | 0.250 | 0.000 | 3 |
| 0 | −1 | −1 | 0 | −y(k) + y(k − 1) | 0.500 | 0.500 | |
| 0 | −1 | −1 | +1 | −y(k) + y(k − 1) | 0.250 | 0.250 | |
| −1 | −1 | −1 | 0/+1 | −y(k) + y(k − 1) | 0.000 | 0.250 | 2 |
| −1 | −1 | +1 | +1 | −y(k) − y(k − 1) | 1.000 | 1.000 | |
| −1 | −1 | +1 | 0/−1 | −y(k) − y(k − 1) | 0.125 | 0.125 | 1, 3 |
| 0/+1 | −1 | +1 | +1 | −y(k) − y(k − 1) | 0.125 | 0.125 | 1, 2 |
| X | −1 | 0 | +1 | −y(k) | 0.125 | 0.125 | |
| +1 | 0 | 0 | +1 | −y(k) + y(k − 1) | 0.500 | 0.500 | |
| +1 | 0 | 0 | 0 | −y(k) + y(k − 1) | 0.250 | 0.000 | 3 |
| +1 | 0 | 0 | −1 | y(k) + y(k − 1) | 0.125 | 0.125 | |
| 0 | 0 | 0 | +1 | −y(k) + y(k − 1) | 0.000 | 0.250 | 2 |
| 0 | 0 | 0 | −1 | y(k) − y(k − 1) | 0.000 | 0.250 | 2 |
| −1 | 0 | 0 | +1 | −y(k) − y(k − 1) | 0.125 | 0.125 | |
| −1 | 0 | 0 | 0 | y(k) − y(k − 1) | 0.250 | 0.000 | 3 |
| −1 | 0 | 0 | −1 | y(k) − y(k − 1) | 0.500 | 0.500 | |
| All other combinations | | | | 0 | 0 | 0 | | wherein note 1 is only applicable if no frequency offset exists, note 2 can only detect late sampling (e(k)<0) and note 3 can only detect early sampling (e(k)>0).

5. The method according to claim 1, wherein the serial data stream is encoded using Pulse-Amplitude-Modulation scheme with two levels and the weight factor is defined in the following table for early and late phase adjustment:

| ŷ(k − 2) | ŷ(k − 1) | ŷ(k) | ŷ(k + 1) | e(k) = | early: w | late: w | note |
|---|---|---|---|---|---|---|---|
| +1 | +1 | +1 | −1 | y(k) − y(k − 1) | 0.000 | 0.250 | 2 |
| −1 | +1 | +1 | −1 | y(k) − y(k − 1) | 0.500 | 0.500 | |
| −1 | +1 | +1 | +1 | y(k) − y(k − 1) | 0.250 | 0.000 | 3 |
| +1 | +1 | −1 | −1 | y(k) + y(k − 1) | 1.000 | 1.000 | |
| +1 | +1 | −1 | +1 | y(k) + y(k − 1) | 0.125 | 0.125 | 1, 3 |
| −1 | +1 | −1 | −1 | y(k) + y(k − 1) | 0.125 | 0.125 | 1, 2 |
| +1 | −1 | −1 | −1 | −y(k) + y(k − 1) | 0.250 | 0.000 | 3 |
| +1 | −1 | −1 | +1 | −y(k) + y(k − 1) | 0.500 | 0.500 | |
| −1 | −1 | −1 | +1 | −y(k) + y(k − 1) | 0.000 | 0.250 | 2 |
| −1 | −1 | +1 | +1 | −y(k) − y(k − 1) | 1.000 | 1.000 | |
| −1 | −1 | +1 | −1 | −y(k) − y(k − 1) | 0.125 | 0.125 | 1, 3 |
| +1 | −1 | +1 | +1 | −y(k) − y(k − 1) | 0.125 | 0.125 | 1, 2 |
| all other combinations | | | | 0 | 0 | 0 | | wherein note 1 is only applicable if no frequency offset exists, note 2 can only detect late sampling (e(k)<0) and note 3 can only detect early sampling (e(k)>0).

6. The method according to claim 1, further comprising the step of filtering the data samples before the step of quantizing the data samples.

7. The method according to claim 6, wherein filtering is performed by a Feed-Forward Equalizer and/or a Decision Feedback Equalizer.

8. The method according to claim 4, comprising the step of adjusting the weights for different states during the initialization procedure of the timing recovery.

9. The method according to claim 1, comprising the step applying the error signal to a bang-bang-detector with adjustable threshold and 3-point control output to quantize the calculated estimated phase error and adjust it to the bit width of a control signal.

10. The method according to claim 9, wherein the calculated estimated phase error is quantized by n-Bit.

11. A timing recovery circuit for recovering a sampling clock from a serial data stream encoded using Pulse-Amplitude-Modulation scheme, comprising:

an analog-to-digital converter for sampling received data signals from the serial data stream once per unit-interval using a sampling clock signal provided by a clock generating device providing a timing recovery loop control, a slicer for quantizing the incoming data samples as corresponding detected symbols, a register for storing adjacent incoming data samples and the corresponding detected symbols to preserve data for phase error estimation, a digital timing error detector for applying a digital filter pattern decoder to the current and last detected symbols to determine if the sequence of current and last detected symbols can be used to estimate a phase offset of the sampling clock signal from the ideal sampling point and for calculating the estimated phase error depending on the detected symbol pattern of four adjacent samples, and wherein the timing recovery circuit is configured so that the phase of the sampling clock signal within the timing recovery loop control is adjusted using the calculated estimated phase error, and the calculated estimated phase error is multiplied with a weight factor to obtain an error signal.

12. The timing recovery circuit according to claim 11, wherein the serial data stream is encoded using Pulse-Amplitude-Modulation scheme with three levels and the estimated phase error is calculated using an equation according to the following table:

| ŷ(k − 2) | ŷ(k −1) | ŷ(k) | ŷ(k + 1) | e(k) = | note |
|---|---|---|---|---|---|
| +1 | +1 | +1 | 0/−1 | y(k) − y(k − 1) | 2 |
| 0 | +1 | +1 | 0 | y(k) − y(k − 1) | |
| 0 | +1 | +1 | −1 | y(k) − y(k − 1) | |
| −1/0 | +1 | +1 | +1 | y(k) − y(k − 1) | 3 |
| −1 | +1 | +1 | 0 | y(k) − y(k − 1) | |
| −1 | +1 | +1 | −1 | y(k) − y(k − 1) | |
| +1 | +1 | −1 | −1 | y(k) + y(k − 1) | |
| +1 | +1 | −1 | 0/+1 | y(k) + y(k − 1) | 1, 3 |
| 0/−1 | +1 | −1 | −1 | y(k) + y(k − 1) | 1, 2 |
| X | +1 | 0 | −1 | y(k) | |
| +1 | −1 | −1 | 0 | −y(k) + y(k −1) | |
| +1 | −1 | −1 | +1 | −y(k) + y(k − 1) | |
| 0/+1 | −1 | −1 | −1 | −y(k) + y(k − 1) | 3 |
| 0 | −1 | −1 | 0 | −y(k) + y(k − 1) | |
| 0 | −1 | −1 | +1 | −y(k) + y(k − 1) | |
| −1 | −1 | −1 | 0/+1 | −y(k) + y(k − 1) | 2 |
| −1 | −1 | +1 | +1 | −y(k) − y(k − 1) | |
| −1 | −1 | +1 | 0/−1 | −y(k) − y(k − 1) | 1, 3 |
| 0/+1 | −1 | +1 | +1 | −y(k) − y(k − 1) | 1, 2 |
| X | −1 | 0 | +1 | −y(k) | |
| +1 | 0 | 0 | +1 | −y(k) + y(k − 1) | |
| +1 | 0 | 0 | 0 | −y(k) + y(k − 1) | 3 |
| +1 | 0 | 0 | −1 | y(k) + y(k − 1) | |
| 0 | 0 | 0 | +1 | −y(k) + y(k − 1) | 2 |
| 0 | 0 | 0 | −1 | y(k) − y(k − 1) | 2 |
| −1 | 0 | 0 | +1 | −y(k) − y(k − 1) | |
| −1 | 0 | 0 | 0 | y(k) − y(k − 1) | 3 |
| −1 | 0 | 0 | −1 | y(k) − y(k − 1) | |
| All other combinations | | | | 0 | | wherein note 1 is only applicable if no frequency offset exists, note 2 can only detect late sampling (e(k)<0) and note 3 can only detect early sampling (e(k)>0).

13. The timing recovery circuit according to claim 11, wherein the serial data stream is encoded using Pulse-Amplitude-Modulation scheme with two levels and the estimated phase error is calculated using an equation according to the following table:

| $\hat{y}(k-2)$ | $\hat{y}(k-1)$ | $\hat{y}(k)$ | $\hat{y}(k+1)$ | e(k) = | note |
|---|---|---|---|---|---|
| +1 | +1 | +1 | −1 | y(k) − y(k − 1) | 2 |
| −1 | +1 | +1 | −1 | y(k) − y(k − 1) |  |
| −1 | +1 | +1 | +1 | y(k) − y(k − 1) | 3 |
| +1 | +1 | −1 | −1 | y(k) + y(k − 1) |  |
| +1 | +1 | −1 | +1 | y(k) + y(k − 1) | 1, 3 |
| −1 | +1 | −1 | −1 | y(k) + y(k − 1) | 1, 2 |
| +1 | −1 | −1 | −1 | −y(k) + y(k − 1) | 3 |
| +1 | −1 | −1 | +1 | −y(k) + y(k − 1) |  |
| −1 | −1 | −1 | +1 | −y(k) + y(k − 1) | 2 |
| −1 | −1 | +1 | +1 | −y(k) − y(k − 1) |  |
| −1 | −1 | +1 | −1 | −y(k) − y(k − 1) | 1, 3 |
| +1 | −1 | +1 | +1 | −y(k) − y(k − 1) | 1, 2 |
|  | all other combinations |  |  | 0 |  | wherein note 1 is only applicable if no frequency offset exists, note 2 can only detect late sampling (e(k)<0) and note 3 can only detect early sampling (e(k)>0).

14. The timing recovery circuit according to claim 11, wherein the serial data stream is encoded using Pulse-Amplitude-Modulation scheme with three levels and the weight factor is defined in the following table for early and late phase adjustment:

| $\hat{y}(k-2)$ | $\hat{y}(k-1)$ | $\hat{y}(k)$ | $\hat{y}(k+1)$ | e(k) = | early: w | late: w | note |
|---|---|---|---|---|---|---|---|
| +1 | +1 | +1 | 0/−1 | y(k) − y(k − 1) | 0.000 | 0.250 | 2 |
| 0 | +1 | +1 | 0 | y(k) − y(k − 1) | 0.500 | 0.500 |  |
| 0 | +1 | +1 | −1 | y(k) − y(k − 1) | 0.250 | 0.250 |  |
| −1/0 | +1 | +1 | +1 | y(k) − y(k − 1) | 0.250 | 0.000 | 3 |
| −1 | +1 | +1 | 0 | y(k) − y(k − 1) | 0.250 | 0.250 |  |
| −1 | +1 | +1 | −1 | y(k) − y(k − 1) | 0.500 | 0.500 |  |
| +1 | +1 | −1 | −1 | y(k) + y(k − 1) | 1.000 | 1.000 |  |
| +1 | +1 | −1 | 0/+1 | y(k) + y(k − 1) | 0.125 | 0.125 | 1, 3 |
| 0/−1 | +1 | −1 | −1 | y(k) + y(k − 1) | 0.125 | 0.125 | 1, 2 |
| X | +1 | 0 | −1 | y(k) |  | 0.125 | 0.125 |
| +1 | −1 | −1 | 0 | −y(k) + y(k − 1) | 0.250 | 0.250 |  |
| +1 | −1 | −1 | +1 | −y(k) + y(k − 1) | 0.500 | 0.500 |  |
| 0/+1 | −1 | −1 | −1 | −y(k) + y(k − 1) | 0.250 | 0.000 | 3 |
| 0 | −1 | −1 | 0 | −y(k) + y(k − 1) | 0.500 | 0.500 |  |
| 0 | −1 | −1 | +1 | −y(k) + y(k − 1) | 0.250 | 0.250 |  |
| −1 | −1 | −1 | 0/+1 | −y(k) + y(k − 1) | 0.000 | 0.250 | 2 |
| −1 | −1 | +1 | +1 | −y(k) − y(k − 1) | 1.000 | 1.000 |  |
| −1 | −1 | +1 | 0/−1 | −y(k) − y(k − 1) | 0.125 | 0.125 | 1, 3 |
| 0/+1 | −1 | +1 | +1 | −y(k) − y(k − 1) | 0.125 | 0.125 | 1, 2 |
| X | −1 | 0 | +1 | −y(k) |  | 0.125 | 0.125 |
| +1 | 0 | 0 | +1 | −y(k) + y(k − 1) | 0.500 | 0.500 |  |
| +1 | 0 | 0 | 0 | −y(k) + y(k − 1) | 0.250 | 0.000 | 3 |
| +1 | 0 | 0 | −1 | y(k) + y(k − 1) | 0.125 | 0.125 |  |
| 0 | 0 | 0 | +1 | −y(k) + y(k − 1) | 0.000 | 0.250 | 2 |
| 0 | 0 | 0 | −1 | y(k) − y(k − 1) | 0.000 | 0.250 | 2 |
| −1 | 0 | 0 | +1 | −y(k) − y(k − 1) | 0.125 | 0.125 |  |

| $\hat{y}(k-2)$ | $\hat{y}(k-1)$ | $\hat{y}(k)$ | $\hat{y}(k+1)$ | e(k) = | early: w | late: w | note |
|---|---|---|---|---|---|---|---|
| −1 | 0 | 0 | 0 | y(k) − y(k − 1) | 0.250 | 0.000 | 3 |
| −1 | 0 | 0 | −1 | y(k) − y(k − 1) | 0.500 | 0.500 |  |
| All other combinations |  |  |  | 0 | 0 | 0 |  | wherein note 1 is only applicable if no frequency offset exists, note 2 can only detect late sampling (e(k)<0) and note 3 can only detect early sampling (e(k)>0).

15. The timing recovery circuit according to claim 11, wherein the serial data stream is encoded using Pulse-Amplitude-Modulation scheme with two levels and the weight factor is defined in the following table for early and late phase adjustment:

| $\hat{y}(k-2)$ | $\hat{y}(k-1)$ | $\hat{y}(k)$ | $\hat{y}(k+1)$ | e(k) = | early: w | late: w | note |
|---|---|---|---|---|---|---|---|
| +1 | +1 | +1 | −1 | y(k) − y(k − 1) | 0.000 | 0.250 | 2 |
| −1 | +1 | +1 | −1 | y(k) − y(k − 1) | 0.500 | 0.500 |  |
| −1 | +1 | +1 | +1 | y(k) − y(k − 1) | 0.250 | 0.000 | 3 |
| +1 | +1 | −1 | −1 | y(k) + y(k − 1) | 1.000 | 1.000 |  |
| +1 | +1 | −1 | +1 | y(k) + y(k − 1) | 0.125 | 0.125 | 1, 3 |
| −1 | +1 | −1 | −1 | y(k) + y(k − 1) | 0.125 | 0.125 | 1, 2 |
| +1 | −1 | −1 | −1 | −y(k) + 3(k − 1) | 0.250 | 0.000 | 3 |
| +1 | −1 | −1 | +1 | −y(k) + y(k − 1) | 0.500 | 0.500 |  |
| −1 | −1 | −1 | +1 | −y(k) + y(k − 1) | 0.000 | 0.250 | 2 |
| −1 | −1 | +1 | +1 | −y(k) − y(k − 1) | 1.000 | 1.000 |  |
| −1 | −1 | +1 | −1 | −y(k) − y(k − 1) | 0.125 | 0.125 | 1, 3 |
| +1 | −1 | +1 | +1 | −y(k) − y(k − 1) | 0.125 | 0.125 | 1, 2 |
| all other combinations |  |  |  | 0 | 0 | 0 |  | wherein note 1 is only applicable if no frequency offset exists, note 2 can only detect late sampling (e(k)<0) and note 3 can only detect early sampling (e(k)>0).

16. The timing recovery circuit according to claim 11, further comprising a digital filter for filtering the data samples before the step of quantizing the data samples.

17. The timing recovery circuit according to claim 16, wherein the digital filter is a Feed-Forward Equalizer and/or a Decision Feedback Equalizer.

18. The timing recovery circuit according to claim 14, wherein the timing recovery circuit adjusts the weights of the digital timing error detector for different states during the initialization procedure of the timing recovery.

19. The timing recovery circuit according to claim 11, comprising a bang-bang-detector with adjustable threshold and 3-point control output to quantize the calculated estimated phase error and adjust it to the bit width of the control signal.

20. The timing recovery circuit according to claim 19, wherein the calculated estimated phase error is quantized by n-Bit.

* * * * *